(12) United States Patent
Droit et al.

(10) Patent No.: US 9,395,392 B2
(45) Date of Patent: Jul. 19, 2016

(54) METHOD OF INTERROGATION OF A DIFFERENTIAL SENSOR OF ACOUSTIC TYPE HAVING TWO RESONANCES AND DEVICE IMPLEMENTING THE METHOD OF INTERROGATION

(75) Inventors: Christophe Droit, Besancon (FR);
Jean-Michel Friedt, Besancon (FR);
Gilles Martin, Chatillon le Duc (FR);
Sylvain Ballandras, Besancon (FR)

(73) Assignee: Senseor, Mougins (FR)

( * ) Notice: Subject to any disclaimer, the term of this patent is extended or adjusted under 35 U.S.C. 154(b) by 889 days.

(21) Appl. No.: 13/588,606

(22) Filed: Aug. 17, 2012

(65) Prior Publication Data

US 2013/0218498 A1 Aug. 22, 2013

(30) Foreign Application Priority Data

Aug. 17, 2011 (FR) ...................................... 11 57379

(51) Int. Cl.
| | |
|---|---|
| *G01R 9/00* | (2006.01) |
| *G01D 5/48* | (2006.01) |
| *G01K 11/22* | (2006.01) |
| *G01H 13/00* | (2006.01) |

(52) U.S. Cl.
CPC .. *G01R 9/00* (2013.01); *G01D 5/48* (2013.01); *G01H 13/00* (2013.01); *G01K 11/22* (2013.01)

(58) Field of Classification Search
CPC .......... G01D 5/48; G01R 9/00; G01H 13/00; G06K 7/00; G06K 19/077; G01K 11/22
See application file for complete search history.

(56) References Cited

U.S. PATENT DOCUMENTS

| | | | |
|---|---|---|---|
| 2003/0102984 A1* | 6/2003 | Elsner et al. | ............. 340/870.16 |
| 2009/0001850 A1 | 1/2009 | Kalinin et al. | |
| 2010/0332157 A1 | 12/2010 | Friedt | |

FOREIGN PATENT DOCUMENTS

WO 2009/103769 A1 8/2009

OTHER PUBLICATIONS

Pohl et al., A review of wireless SAW sensors,2000,IEEE, 0885-3010, vol. 47,317-332.*
Cunha et al., Wireless Acoustic Wave Sensors and System for Harsh Enviroment Apllications,2011,IEEE, 978-1-4244-7685-5/11, 44-44.*
Buff et al., Differential measuremet SAW Device for passive remote sensors,1996,IEEE,0-7803-3615-1, 343-346.*
Reindl et al., SAW Devices as Wireless Passive Sensors,1996,IEEE,0-7803-3615-1/96,363-367.*

(Continued)

*Primary Examiner* — John Breene
*Assistant Examiner* — Mohammad Islam
(74) *Attorney, Agent, or Firm* — Baker & Hostetler LLP

(57) ABSTRACT

A method of interrogating a surface acoustic wave differential sensor formed by two resonators is provided, wherein the method allows the measurement of a physical parameter by determination of the difference between the natural resonant frequencies of the two resonators, which difference is determined on the basis of the analysis of a signal representative of the level of a signal received as echo of an interrogation signal, for a plurality of values of a frequency of the interrogation signal in a domain of predetermined values; the analysis can be based on the cross-correlation of the said signal representative of the level according to a splitting into two distinct frequency sub-bands. An advantage is that it may be implemented in a radio-modem.

13 Claims, 4 Drawing Sheets

(56) References Cited

OTHER PUBLICATIONS

J.M. Friedt, et al, "A Wireless Interrogation System Exploiting Narrowband Acoustic Resonator for Remote Physical Quantity Measurement", Review of Scientific Instruments, Jan. 11, 2010, pp. 14701-1-14701-9, vol. 81, No. 1, American Institute of Physics, Melville, NY, USA, XP012134609.

Alfred Pohl, "A Review of Wireless SAW Sensors", IEEE Transactions on Ultrasonics, Ferroelectrics and Frequency Control, Mar. 1, 2000, pp. 317-332, vol. 47, No. 2, IEEE, USA, XP011264630.

Matthias Hamsch, et al, "An Interrogation Unit for Passive Wirelss SAW Sensors Based on Fourier Transform", IEEE Transactions on Ultrasonics, Ferroelectrics, and Frequency Control, Nov. 2004, pp. 1449-1456, vol. 51, No. 11, IEEE.

* cited by examiner

METHOD OF INTERROGATION OF A DIFFERENTIAL SENSOR OF ACOUSTIC TYPE HAVING TWO RESONANCES AND DEVICE IMPLEMENTING THE METHOD OF INTERROGATION

CROSS-REFERENCE TO RELATED APPLICATION

This application claims priority to foreign French patent application No. FR 1157379, filed on Aug. 17, 2011, the disclosure of which is incorporated by reference in its entirety.

FIELD OF THE INVENTION

The present invention relates to a method of interrogating a differential sensor exhibiting at least two resonances having a sensitivity specific to one or more phenomena to be characterized. The present invention also relates to a device implementing such a method. It applies notably to passive differential sensors formed by a pair of resonators. These resonators can advantageously be of surface or bulk acoustic wave type.

BACKGROUND

A differential sensor may be formed by a pair of resonators, it being possible for each of the resonators to be made by depositing microstructures on the surface of a piezoelectric substrate. Such resonators belong to the family of components of surface acoustic wave type, commonly denoted "SAW" components, according to the acronym corresponding to the English terminology "Surface Acoustic Wave", or of bulk acoustic wave type, commonly denoted according to the acronym "BAW" corresponding to the English terminology "Bulk Acoustic Wave".

The present invention relates to differential sensors responsive to various physical parameters, for example temperature or pressure. SAW and BAW resonators exhibit the advantage of being able to be interrogated remotely, but also of not requiring a power supply. Hereinafter, reference will be made to the interrogation of an SAW or BAW sensor, to denote the gathering of the information relating to the measurement of a physical parameter.

In a typical manner, SAW sensors, for example, may be made by depositing metallic patterns on the piezoelectric substrate, the piezoelectric material possibly consisting for example of quartz ($SiO_2$), lithium niobate ($LiNbO_3$) or lithium tantalate ($LiTaO_3$). A resonator may for example consist of interdigital transducers, around which are distributed reflectors and electrodes. Radiofrequency electromagnetic signals may give rise to the generation of a surface acoustic wave, e.g. Rayleigh wave, by the transducers, the acoustic wave then propagates within the array of electrodes and reflectors, and the transducers re-emit a radiofrequency signal which may be picked up by an antenna, and analysed by appropriate means. By design, a resonator offers a natural resonant frequency, dependent notably on the physical configuration of the resonator and on the choice of materials of which it consists. The natural resonant frequency of a resonator is also dependent on the surrounding physical parameters, such as the temperature or pressure. A differential structure makes it possible for example to carry out the measurement of a specific parameter, circumventing the simultaneous influence of other physical parameters. Such a structure furthermore allows easy calibration of the sensor. In a differential structure, one of the two resonators is commonly denoted the reference resonator, the other resonator being denoted the measurement resonator.

The measurement of the physical parameter considered is performed by assessing the difference between the natural resonant frequencies of the two resonators forming the differential sensor. Hence, it is preferable that the resonators forming the differential sensor be configured so that their respective resonant frequencies are situated in distinct frequency bands, and that the difference of the two resonant frequencies define a bijective function of the physical parameter measured, in such a way that a one-to-one relation makes it possible to carry out the measurement.

The interrogation of a differential sensor is the method by which an interrogation device emits an appropriate radiofrequency signal destined for the sensor, the radiofrequency signal then being perceived by the differential sensor via a reception radiofrequency antenna, and giving rise to the propagation of a surface acoustic wave (or bulk wave, in the case of devices of BAW type), the latter being in its turn translated into a radiofrequency signal re-emitted via an emission antenna, the latter possibly being formed by the aforementioned reception antenna, it then being possible for the radiofrequency signal thus re-emitted to be gathered and analysed by the interrogation device. The interrogation signal emitted can take the form of a brief radiofrequency pulse.

In a typical manner, the aforementioned radiofrequency signals are situated in a frequency band denoted ISM, according to the initials denoting the English terminology "Industrial, Scientific, Medical". A first ISM band is situated around the frequency of 434 MHz, with a bandwidth of 1.7 MHz. This frequency band is particularly advantageous, notably because of the signal penetration depth that it affords, in dielectric media within which the sensors may be used. However, the relatively low passband is notably prejudicial to the signal-to-noise ratio, and therefore to the maximum interrogation distance. This phenomenon is all the more significant for differential sensors, for which the frequency bands, wherein lie the ranges of values of resonant frequency of the resonators of which they consist, must be distinct, as is explained above. A background issue related to the interrogation of SAW sensors thus pertains to the signal-to-noise ratio afforded by the method of interrogation.

Known solutions of the prior art allow the interrogation of SAW resonators.

According to a first known technique, described in the publication "Friedt, J.-M.; Droit, C.; Martin, G.; Ballandras, S. "A wireless interrogation system exploiting narrowband acoustic resonator for remote physical quantity measurement", Rev. Sci. Instrum. Vol. 81, 014701 (2010)", the interrogation may be carried out by a frequency scan of the interrogation signal of smaller spectral bandwidth than the width of the resonance, around the natural resonant frequency of the first resonator on the one hand, and of the second resonator on the other hand, followed by an analysis of the power of the signal received as echo, the emission frequencies for which the power of the signal received is maximal then determining the two natural resonant frequencies sought. A radiofrequency switch can make it possible to alternate emission phases and listening phases. This first technique presents notably the drawback of requiring wide-band power detectors, these devices being relatively complex and expensive.

According to a second known technique, described in the publication "Hamsch, M.; Hoffmann, R.; Buff, W.; Binhack, M.; Klett, S.; "An interrogation unit for passive wireless SAW sensors based on Fourier transform Ultrasonics, Ferroelectrics and Frequency Control", IEEE Transactions on, November 2004", the interrogation may be carried out by a frequency scan of an interrogation signal of larger spectral breadth than the sensor resonance width, in a frequency range covering the two natural resonant frequencies of the resonators, followed by an analog-to-digital conversion of the signal received as echo, making it possible to carry out a fast Fourier transform and an extraction of the spectrum of this signal, from which the two natural resonant frequencies sought may be deduced. This second technique presents notably the drawback of requiring significant calculation means.

SUMMARY OF THE INVENTION

One aim of the present invention is to overcome at least the aforementioned drawbacks, by proposing a method of interrogating differential sensors offering a good signal-to-noise ratio, good measurement precision, without requiring complex calculation means.

Another advantage of the invention is that the latter can readily be implemented via a device of radio-modem type available on the market for a reasonable cost, and not dedicated specifically to applications of this type.

For this purpose, the subject of the invention is a method of interrogating a sensor comprising at least two resonators whose natural resonant frequency is dependent on a physical parameter, the method comprising a step of emitting an electromagnetic signal whose frequency is varied in a frequency band by increments of determined value, from a predetermined minimum value to a predetermined maximum value, the frequency band being split into two frequency sub-bands, each frequency sub-band containing at least the expected values respectively of each natural resonant frequency of the two resonators; a step of gathering a signal received as echo after a determined duration after the emission carried out in the emission step, for each frequency of the electromagnetic signal emitted; a step of transposing the signal received as echo to low frequency by mixing with a radiofrequency signal whose frequency equals the frequency of the electromagnetic signal emitted; a filtering step making it possible to eliminate the high frequencies of the signal mixed in the transposition step, a step of determining the difference between the respective natural resonant frequencies of the said two resonators, on the basis of the cross-correlation maximum of the characteristics constituted by the level of the signal received as echo for each frequency sub-band as a function of the frequency of the electromagnetic signal emitted.

In one embodiment of the invention, the cross-correlation maximum may be defined by the maximum value of the cross-correlation coefficient defined according to the relation:

$$X_{corr}(t) = \sum_{k=-M}^{M} s_1(k)s_2(k-t),$$

in which t denotes a frequency gap, $s_1$ denotes the level of the signal received in the first frequency sub-band, and $s_2$ denotes the level of the signal received in the second frequency band, M denoting a number of interrogation frequency points in a frequency sub-band, the second frequency sub-band assumed to contain at least the second resonant frequency comprising N–M points, N being the total number of interrogation frequency points.

In one embodiment of the invention, the narrowest sub-band may be supplemented with zeros for the interrogation frequency points situated outside of the measurement band, in such a way that the number of frequency points is identical for the two frequency sub-bands.

In one embodiment of the invention, the said difference between the natural resonant frequencies may be determined according to the relation: $f_2-f_1=(t+M)\cdot\Delta f$, t denoting the frequency gap for which the cross-correlation coefficient is maximal.

The subject of the present invention is also a method of interrogating a sensor comprising at least two resonators whose natural resonant frequency is dependent on a physical parameter comprising a step of emitting an electromagnetic signal whose frequency is varied in a frequency band by increments of determined value, from a predetermined minimum value to a predetermined maximum value; a step of gathering a signal received as echo after a determined duration after the emission carried out in the emission step, for each frequency of the electromagnetic signal emitted; a step of transposing the signal received as echo to low frequency by mixing with a radiofrequency signal whose frequency equals the frequency of the electromagnetic signal emitted; a filtering step making it possible to eliminate the high frequencies of the signal mixed in the transposition step; a step of determining the difference between the respective natural resonant frequencies of the said two resonators, on the basis of the auto-correlation maximum of the characteristic constituted by the level of the signal received as echo.

In one embodiment of the invention, the characteristic constituted by the level of the signal received as echo may be formed by the characteristic of the amplitude of the in-phase component of the said signal received.

In one embodiment of the invention, the characteristic constituted by the level of the signal received as echo may be formed by the characteristic of the amplitude of the quadrature component of the said signal received.

In one embodiment of the invention, the interrogation method can comprise an adjustment step bringing the base line of the characteristics constituted by the level of the signal received as echo to a constant value.

In one embodiment of the invention, the said constant value may be zero.

The subject of the present invention is also an interrogation device characterized in that it implements an interrogation method according to any one of the preceding claims, the interrogation device comprising at least one radiofrequency switch, a radiofrequency signal generator controlled by the radiofrequency switch and emitting the interrogation signals at the said variable frequency, an emission antenna, a reception antenna receiving the signals as echo, an amplification module amplifying the signals received by the reception antenna, a mixer mixing the amplified signal received as echo and a periodic signal at the said variable frequency, a low-pass filter linked to an output of the mixer, storage means storing the level of the mixed and filtered signal, calculation and analysis means determining the said cross-correlation maximum or auto-correlation maximum.

In one embodiment of the invention, the interrogation device may be formed by a device of radio-modem type.

The embodiments of the invention which are presented hereinafter apply to differential sensors of SAW or BAW type.

BRIEF DESCRIPTION OF THE DRAWINGS

Other characteristics and advantages of the invention will become apparent on reading the description, given by way of example, in conjunction with the appended drawings which represent.

DETAILED DESCRIPTION

Figure 1:
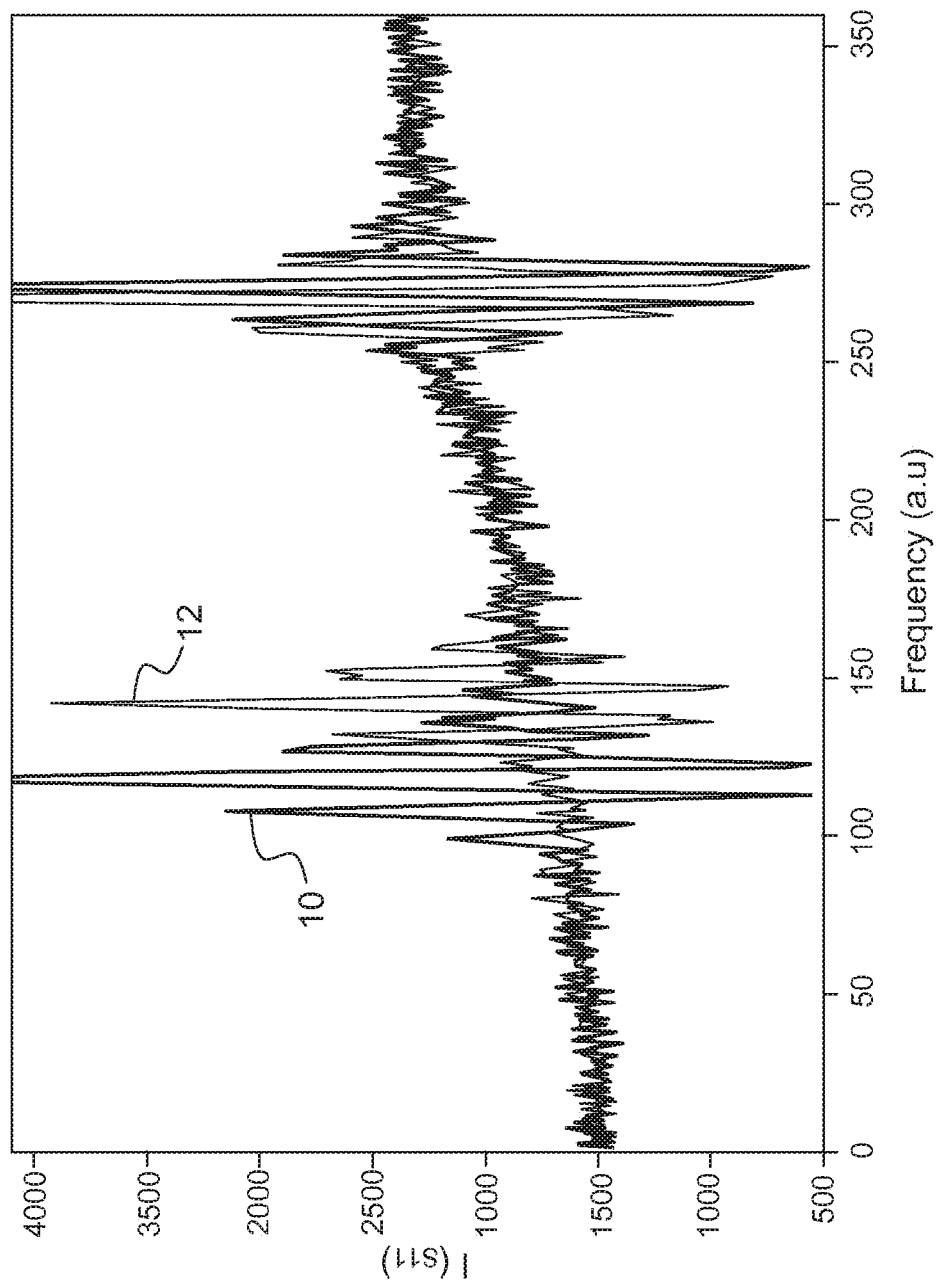
FIG. 1, curves illustrating the impulse response of a differential SAW or BAW sensor as a function of the frequency of an emitted radiofrequency pulse.

By a scan by a frequency increment $\Delta f$ of the frequency f of an impulse radiofrequency interrogation signal, it is possible to excite a resonator, the spectral breadth of the radiofrequency pulse emitted being for example smaller than the resonator mid-height width, centred on the frequency of the interrogation signal f. The fraction of energy of the pulse emitted overlapping the resonator transfer function excites an acoustic mode, allowing the resonator to accumulate energy. At the end of emission, the resonator dispatches as echo a signal: the larger the spectral overlap, the larger the returned power, the power being maximal when the frequency f corresponds to the natural resonant frequency $f_0$ of the resonator.

According to the present invention, it is proposed to reduce the radiofrequency signal received as echo to a lower frequency by mixing with a radiofrequency signal whose frequency is equal to the frequency f of the radiofrequency pulse emitted. The mixing of frequencies generates a beat between the frequency f of emission and the natural resonant frequency $f_0$ of the resonator, the temporal expression for which may be formulated according to the following relation:

$$\text{signal}=\sin((f\pm f_0)t) \quad (1).$$

The frequencies f and $f_0$ correspond respectively to angular frequencies $\omega$ and $\omega_0$. Thus, relation (1) hereinabove can also be written in the following form:

$$\text{signal}=\cos((\omega+\omega_0)t)+\cos((\omega-\omega_0)t) \quad (2).$$

By keeping only the low-frequency component of the signal arising from the mixing, that is to say the term in each of relations (1) and (2) hereinabove comprising only the differential component of frequencies or of angular frequencies, and by considering a determined temporal instant, it is possible to represent the characteristic of the level of this signal, in terms of mean amplitude or of power, as a function of the emitted frequency f. In practice, a mixer can allow the mixing of the frequencies, and the output signal of the mixer may be filtered by a low-pass filter of appropriate cutoff frequency; the determined temporal instant may be chosen at a determined duration after the start or the end of the radiofrequency pulse, this duration being chosen in an optimal manner, so that the echo signal received can be best utilized, that is to say typically at a duration subsequent to a phenomenon of saturation of a reception stage, and sufficiently early to contain a maximum of useful information. In the examples described hereinafter, the determined instant is chosen at a duration of 13 μs after the start of the echo signal listening window. This value is not limiting of the present invention, and corresponds to a particularly favourable experimental configuration but does not represent a unique measurement compromise, and in this respect may be modified for any other specific optimization. Exemplary embodiments of an interrogation device according to the present invention are described hereinafter, with reference to FIGS. 5 and 6.

In the case of a differential SAW sensor such as described above, comprising two resonators of respective natural resonant frequencies denoted $f_1$ and $f_2$, it is possible to vary the frequency emitted f at least between a first minimum frequency $f_{1min}$ and a first maximum frequency $f_{1max}$, and then between a second minimum frequency $f_{2min}$ and a second maximum frequency $f_{2max}$, so as to cover all the values that the natural resonant frequencies $f_1$ and $f_2$ of the two resonators can take within the system with which they are integrated. An example of the level/frequency characteristic thus obtained is presented in FIG. 1. The physical parameter measured in the examples described is the temperature. Of course, the present description may be transposed to cases where other physical parameters are measured, such as pressure, stresses or else a torque.

FIG. 1 presents a first curve 10, dotted, representing the level of the aforementioned mixed and filtered signal, as a function of frequency f, at a first temperature, for example ambient temperature. In the same manner, the first curve 10 can represent the real part (I) or imaginary part (Q) of the reflection coefficient of the resonator pair as a function of frequency f. A second curve 12, solid, represents the level of the mixed and filtered signal as a function of frequency f, at a second, higher temperature. In the example illustrated by FIG. 1, 360 samples or "points" of frequency f are plotted as abscissa, spanning the frequency range considered, for example between about 433 MHz and 435 MHz covering the ISM band centred on 433.9 MHz.

The spikes of maximum levels on the two curves 10, 12 correspond to the two natural resonant frequencies $f_1$ and $f_2$. In the example illustrated by FIG. 1, at ambient temperature, the natural resonant frequencies $f_1$ and $f_2$ are situated approximately at the points 120 and 270, respectively, corresponding to the maximum spikes of the first curve 10. At a higher temperature, the natural resonant frequencies $f_1$ and $f_2$ are situated approximately at the points 150 and 270, respectively, corresponding to the maximum spikes of the second curve 12. In this example, the first resonator, whose natural resonant frequency $f_1$ is below the natural resonant frequency $f_2$ of the second resonator, is the measurement resonator, that is to say that which is sensitive to the measured parameter, i.e. the temperature in the example illustrated. Hence, in this example, the first resonator is the reference resonator; also in this example, the higher the temperature, the smaller the difference between the natural resonant frequencies $f_1$ and $f_2$. The temperature can thus be deduced from the difference between the two natural resonant frequencies $f_1$ and $f_2$, using prior knowledge of the resonant frequency/temperature characteristics of the resonators.

From a practical point of view, it is for example possible to utilize the level of the in-phase or quadrature components arising from the aforementioned mixed and filtered signal. The in-phase and quadrature components are commonly denoted respectively by the letters I and Q. It is also possible to utilize the level of a signal reconstructed on the basis of the components I and Q, for example the modulus or the square of the modulus of the mixed and filtered signal, $I^2+Q^2$. The characteristic of the square of the modulus of the mixed and filtered signal, as a function of the frequency of the interrogation signal emitted is not represented in the figure: the latter would not exhibit the oscillations appearing in curves 10, 12. Finally, it is possible to reconstruct a complex quantity (real and imaginary parts) of a signal on the basis of this information.

Figure 2:
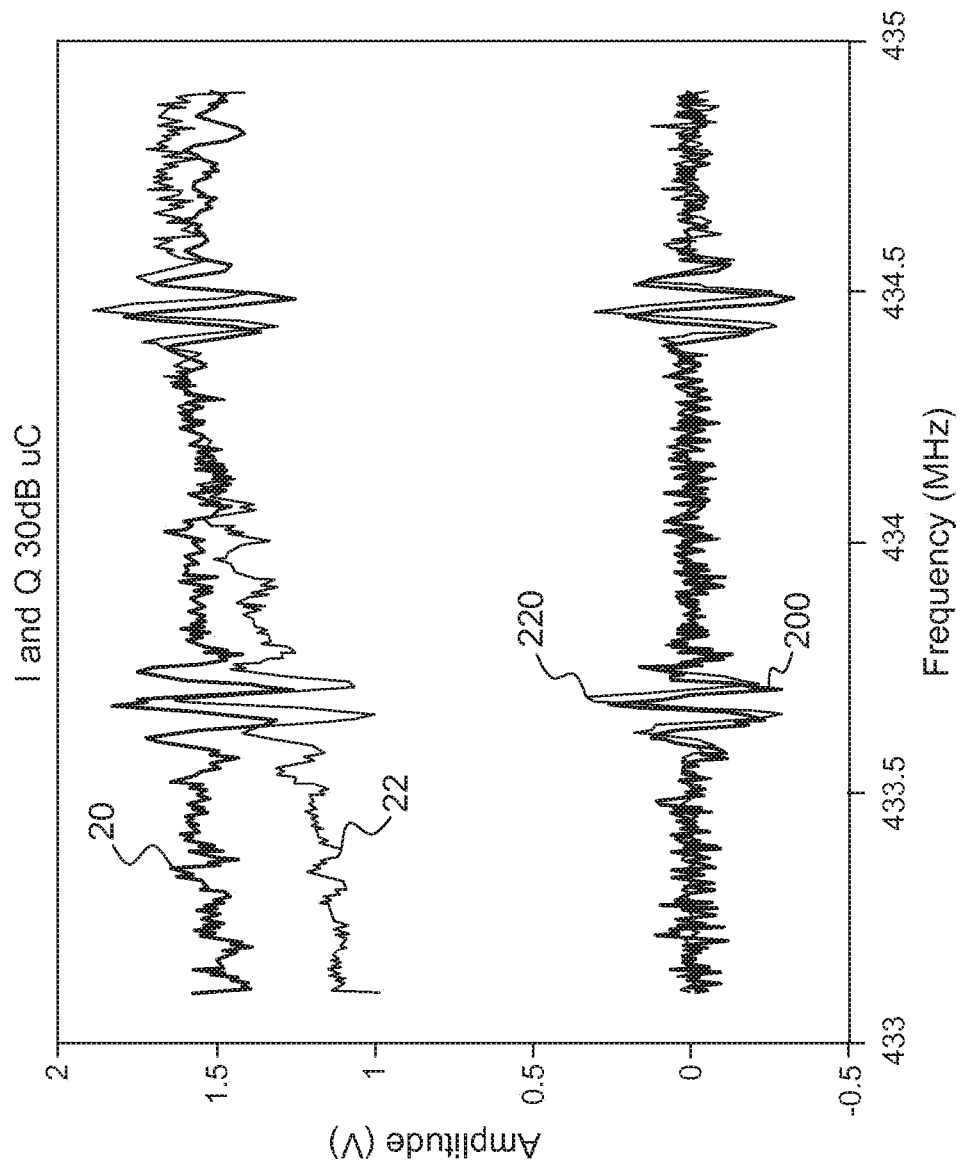
FIG. 2, curves illustrating the spectral response of a differential SAW sensor as a function of the frequency of an emitted radiofrequency pulse, and the curves resulting therefrom after appropriate processing.

FIG. 2 presents curves illustrating the spectral response of the differential sensor formed by the two resonators, as a function of the frequency f of the radiofrequency pulse emitted, and the curves resulting therefrom after appropriate processing.

In FIG. 2, a first curve 20, dotted, represents the level of the in-phase component I of the mixed and filtered signal, as a function of the frequency f of the radiofrequency pulse emitted. A second curve 22 represents the level of the quadrature component Q of the signal, as a function of the frequency f. The base line of the two curves 20, 22 is not centred on a constant value. Also, the mean values of the two curves 20, 22 are not necessarily equal.

Appropriate adjustment means can advantageously make it possible to bring the base line of the two curves 20, 22 to a constant value, advantageously a zero value. A third curve 200 and a fourth curve 220 correspond respectively to the first and second curves 20, 22 brought to a constant base line of zero mean value.

According to a first embodiment of the invention, it is possible to determine the difference between the two natural resonant frequencies $f_1$ and $f_2$ by splitting the frequency domain in two sub-bands: a first frequency sub-band containing at least the natural resonant frequency $f_1$ of the first resonator, and a second frequency sub-band containing at least the natural resonant frequency $f_2$ of the second resonator. The two sub-bands may be chosen so that the characteristics of the level of the mixed and filtered signal are similar in the two sub-bands. The closer the quality factors exhibited by the two resonators forming the differential sensor, the greater the similarity of the spectral responses, a feature generally sought by designers of a differential sensor.

An estimator of the similarity between the characteristics of the level of the mixed and filtered signal in the two sub-bands may be formed by the cross-correlation coefficient defined by the following relation:

$$X_{corr}(t) = \sum_{k=-M}^{M} s_1(k) s_2(k-t); \quad (3)$$

where M denotes a number of interrogation frequency points f in a frequency sub-band, the second frequency sub-band assumed to contain at least the second resonant frequency comprising N–M points (the two frequency sub-bands being scanned by the same frequency increment $\Delta f$). During the cross-correlation calculation, the smallest sub-band is supplemented with zeros outside of the measurement band, according to a principle commonly denoted by the term "zero-padding", $s_1$ and $s_2$ denote respectively the level of the mixed and filtered signal for the first and the second frequency sub-band. The variable t, conventionally called a delay, representing the interval by which it is necessary to shift the signal $s_1$ so that the latter best resembles the signal $s_2$, is in reality only a shift index for $s_1$ with respect to $s_2$. Hereinafter in the present description, the signals $s_1$ and $s_2$ are spectral responses (reflection coefficient as a function of frequency); for the sake of clarity, although the abscissae represent frequency values, and though in reality the value to be determined is a frequency gap between $f_1$ and $f_2$ through utilizing the aforementioned relation (3), the phraseology consisting in calling t a "delay" will be retained.

The cross-correlation coefficient $X_{corr}$ such as defined in relation (3) hereinabove exhibits a maximum value positioned for a delay t corresponding to the translation of the signal $s_2$ so that the latter exhibits a maximum resemblance with the signal $s_1$. The level of the cross-correlation maximum may be utilized to validate the quality of the measurement: under a predefined threshold, the measurement may be considered to be invalid, and the position of the cross-correlation maximum provides the sought-after information regarding the difference of frequencies.

In order to circumvent artefacts of the calculation of the cross-correlation estimator (bias associated with a non-zero mean value), the aforementioned appropriate means making it possible to bring the base line of the two curves 20, 22 to a constant value, can for example consist in deducting a polynomial adjustment at a plurality of points, for each of the two signals independently.

The cross-correlation coefficient makes it possible to determine the distance between the two signals representative of the resonances: only the presence of resonances can provide a non-zero correlation. In practice, it is for example possible to carry out the correlation product of the signals $s_1$ and $s_2$ and to extract therefrom the maximum value, so as to allow the determination of the difference between the two natural resonant frequencies $f_1$ and $f_2$.

As described hereinabove, the level characteristic of the signal received as echo can be formed by the amplitude characteristic of the in-phase I component of the received signal, or by the amplitude characteristic of the quadrature Q component of this signal.

In an embodiment, the level characteristic of the signal received as echo can be formed by the complex number formed by the in-phase and quadrature components, that is: I+jQ, where $j^2=-1$. Utilizing this characteristic brings the advantage of an improved stability of the measurement result as a function of the sensor's surroundings. The difference between the two natural resonance frequencies f1 and f2 can then be determined based upon the maximal value of the modulus of the cross-correlation function max(|xcorr(I+jQ)|).

Advantageously, with the embodiment described hereinabove, it is possible to free the measurement from a residual bias with the electromagnetic surroundings of the interrogator, through applying a correction of the difference of frequencies thus obtained. This correction can be done by means of a linear function of the phase of the cross-correlation function φ(|xcorr(I+jQ)|) considered at the position of the maximum of the modulus of the cross-correlation function, the phase of the complex cross-correlation presenting a bijective function with the residual bias cited hereinabove. Such a correction can be comprised in an additional step in a method according to one of the described embodiments.

Knowing the frequency bounds of the two frequency sub-bands denoted respectively by the intervals $[f_{1min}; f_{1max}]$ and $[f_{2min}; f_{2max}]$ containing the signals $s_1$ and $s_2$ respectively, assuming that the total frequency band $N \times \Delta f$ is scanned as N points by increments of $\Delta f$, by measuring two sub-bands of indices from 0 to M and M to N (N–M optionally being different from M, M being in practice for example greater than or equal to N–M), then having identified the delay (that is to say a frequency gap, as described previously) t which maximizes the cross-correlation of the signals $s_1$ and $s_2$, the frequency gap between the resonant frequencies of the two transducers can be formulated according to the following relation:

$$f_2-f_1=(t+M)\cdot\Delta f+(f_{2min}-f_{1max}) \quad (4).$$

Relation (4) hereinabove is the general law when the two frequency sub-bands [$f_{1min}$; $f_{1max}$] and [$f_{2min}$; $f_{2max}$] are not contiguous. In practice, it may be preferable to choose the bounds of the two frequency sub-bands in such a way that the maximum frequency $f_{1max}$ of the first frequency band is equal to the minimum frequency $f_{2min}$ of the second frequency sub-band: thus, the law formulated in relation (4) can be written more simply according to the following relation:

$$f_2-f_1=(t+M)\cdot\Delta f \quad (5).$$

It is recalled here that the delay t lies in the range [−M; +M], the frequency gap between the resonant frequencies is thus indeed greater than or equal to 0.

Advantageously, it is possible to undertake an adjustment, for example a polynomial adjustment, such as a parabolic adjustment, of the correlation product of the signals $s_1$ and $s_2$, so as to improve the resolution of the measurement. This adjustment is aimed at remedying the problem of variable base level, associated with insufficient isolation between emission and reception. It is also possible to remedy this problem by optimizing the isolation between emission and reception, for example by resorting to a bistatic configuration or else using a radiofrequency switch between the interrogator emission and reception pathways. This parabolic adjustment is performed in the neighbourhood of the cross-correlation spike maximum, determined in the first instance by a search for a maximum once the ISM band has been entirely scanned, in accordance with a procedure in itself known and described in the international patent application published under the reference WO/2009/103769.

In an alternative embodiment of the present invention, it is possible to determine the auto-correlation of the level of the mixed and filtered signal over the whole of the frequency band, that is to say comprising the two aforementioned sub-bands. The auto-correlation exhibits a maximum for a zero delay, as well as two secondary maxima on either side of this maximum. The distance between these two secondary maxima then makes it possible to directly determine double the frequency gap between the two natural resonant frequencies $f_1$ and $f_2$, or else the frequency gap between the maximum of the auto-correlation curve (zero delay) and each secondary maximum, thus offering a redundant but safe measurement. This embodiment requires more calculation resources than the mode previously described based on an cross-correlation in two frequency sub-bands, however it exhibits the benefit of not requiring a splitting of the measurement into two distinct sub-bands and in fact allows complete utilization of the ISM band, the resonant frequencies thus being able to evolve within a priori fixed bounds.

Figure 3:
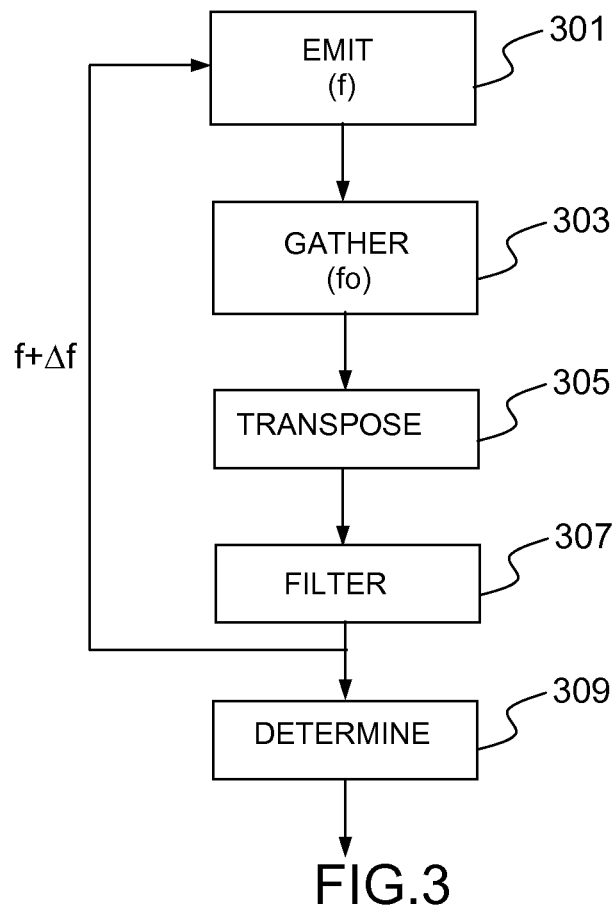
FIG. 3, a logic diagram illustrating a method of interrogating a differential SAW or BAW sensor, according to one embodiment of the invention.

FIG. 3 presents a logic diagram illustrating a method of interrogating a differential SAW or BAW sensor, according to one embodiment of the invention. The steps described by way of example in FIG. 3 essentially implement the principles mentioned above.

An interrogation method can comprise a step 301 of emitting a radiofrequency electromagnetic signal of a variable frequency f. In a first iteration, the frequency can have a minimum value $f_{min}$. The emission step 301 may be followed by a step 303 of gathering the signal received as echo of the differential sensor.

A transposition step 305 can then allow the implementation of the mixing of the signal received as echo with a radiofrequency signal whose frequency equals the frequency f of the electromagnetic signal emitted.

A filtering step 307 can then make it possible to eliminate the high frequencies of the signal mixed during the transposition step 305.

The interrogation frequency f can then be varied, for example by a frequency increment $\Delta f$, and the method can resume at the emission step 301, until the filtering step 307, until the interrogation frequency f has been varied throughout the domain, covering at least the frequency ranges comprising the possible values of the two natural resonant frequencies $f_1$ and $f_2$.

From a practical point of view, for the implementation of the first aforementioned embodiment, the splitting into two frequency sub-bands may be prior, and the interrogation frequency f may be varied in a first frequency sub-band stretching at least from the first minimum frequency $f_{1min}$ to the first maximum frequency $f_{1max}$, and then in a second frequency sub-band stretching at least from the second minimum frequency $f_{2min}$ to the second maximum frequency $f_{2max}$. The interrogation frequency f can also be varied throughout the frequency band covering at least the frequency domain lying between the first minimum frequency $f_{1min}$ and the second maximum frequency $f_{2max}$, it being possible for the sub-band splitting to be carried out a posteriori.

As soon as the interrogation frequency f has been varied throughout the frequency domain of interest, a determination step 309 can allow the determination of the difference between the natural resonant frequencies $f_1$ and $f_2$, by an analysis of the characteristic of the level of the mixed and filtered signal, as a function of the interrogation frequency f, as is described above. The analysis means can for example carry out the correlation product of the signals $s_1(f)$ and $s_2(f)$ within the framework of the first embodiment described above, or else the auto-correlation of the single signal s(f) within the framework of the second embodiment described, and then extract therefrom the maximum value.

Figure 4:
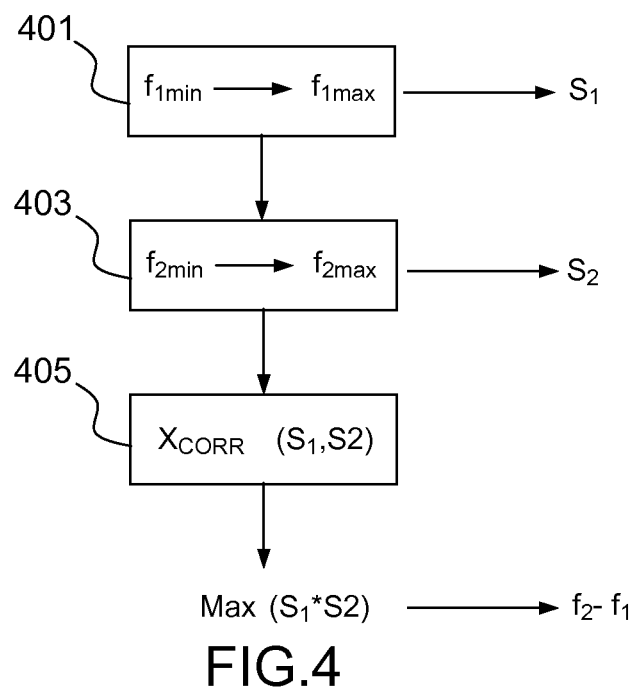
FIG. 4, a logic diagram illustrating a method of interrogating a differential SAW or BAW sensor, according to an exemplary embodiment of the invention.

FIG. 4 presents a logic diagram illustrating a method of interrogating a differential SAW or BAW sensor, according to an exemplary embodiment of the invention.

The example illustrated by FIG. 4 relates to an interrogation method according to the first embodiment described above, in which the frequency is varied in two distinct frequency sub-bands.

A first gathering step 401 can allow the extraction of a first signal $s_1(f)$, by variation of the interrogation frequency f between the first minimum frequency $f_{1min}$ and the first maximum frequency $f_{1max}$, by carrying out the aforementioned steps 301 to 307 described with reference to FIG. 3.

A second gathering step 403 can allow the extraction of a second signal $s_2(f)$, by variation of the interrogation frequency f between the second minimum frequency $f_{2min}$ and the second maximum frequency $f_{2max}$, also by carrying out the aforementioned steps 301 to 307 described with reference to FIG. 3.

It should be noted that the example illustrated by FIG. 4 pertains to an interrogation method according to the first aforementioned embodiment, in which the variable frequency is varied in two distinct frequency sub-bands. In the case of the second embodiment described above, the frequency can be varied only in a single frequency band, in which case a single signal s(f) can be extracted during a single gathering step, not represented in the figure.

The second gathering step 403 can then be followed by a step 405 of calculating the correlation product of the signals $s_1(f)$ and $s_2(f)$. It should be noted that in the calculation step 405, in a similar manner the auto-correlation of the single signal s(f) can be calculated, in the case of the second embodiment described above.

On completion of the calculation step 405, it is possible to determine, by appropriate calculation means, the maximum value of the correlation product or of the auto-correlation, and to directly deduce therefrom the value of the difference between the natural frequencies $f_1$ and $f_2$ of the two resonators, and therefore the quantized value of the physical parameter measured.

As is described above, intermediate steps may be added to the logic diagrams presented in FIGS. 3 and 4. For example, an adjustment step may be carried out, downstream of the gathering steps 401, 403 with reference to FIG. 4, allowing the subtraction of a parabolic adjustment from the signals $s_1$ and $s_2$, on the basis of a plurality of determined points.

Advantageously again, an extra adjustment step may be carried out on completion of the correlation product determination carried out during the calculation step 405, with reference to FIG. 4, allowing the adjustment of the cross-correlation between the signals $s_1(f)$ and $s_2(f)$, or of the auto-convolution of the signal s(f).

Advantageously again, it is possible, within the framework of the first aforementioned embodiment, on completion of the determination of the difference between the natural resonant frequencies $f_1$ and $f_2$, to adjust the frequency bound of the second frequency bound scanned on the basis of which the scan of the interrogation frequency f is carried out, in such a way that the following relation is satisfied:

$$f_{2min} + N_T \times \Delta f = f_2 - f_1 + f_{1min} \quad (6);$$

where $N_T$ denotes the total number of interrogation frequency points in a frequency sub-band.

It is thus possible to determine the value of the second minimum frequency $f_{2min}$.

Figure 5:
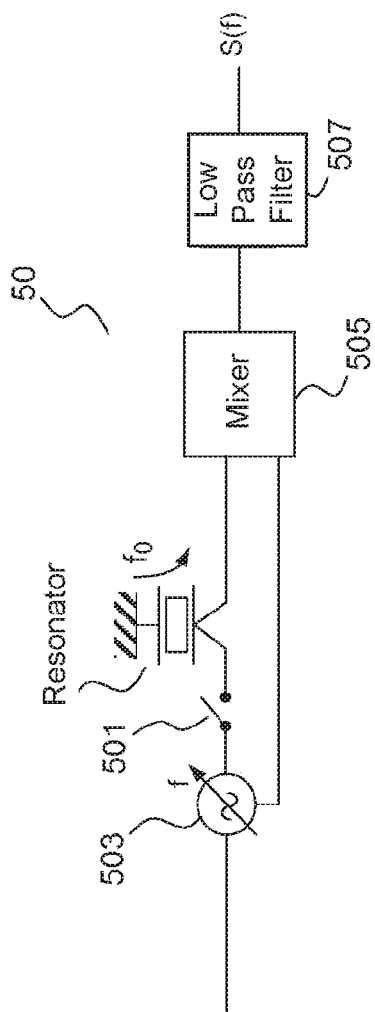
FIG. 5, a diagram illustrating in a schematic manner a device for interrogating a differential SAW or BAW sensor, in an exemplary embodiment of the invention.

FIG. 5 presents a diagram illustrating in a schematic manner, a device for interrogating a differential SAW or BAW sensor, in an exemplary embodiment of the invention.

An interrogation device 50 can comprise a radiofrequency switch 501, controlling the emission of the radiofrequency pulses, via a radiofrequency signal generator 503, and an antenna, not represented in the figure. The radiofrequency signal generator 503 allows the emission of the impulse interrogation signals at the variable frequency f.

In the example illustrated by FIG. 5, a single resonator R is represented. The latter, as echo of the interrogation radiofrequency signal received, re-emits in its turn an echo signal, essentially at its natural resonant frequency $f_0$. The echo signal may be received by an antenna, not represented in the figure, and amplified by an amplification module, also not represented in the figure. A mixer 505 can allow the mixing of the echo signal and of the variable frequency f, as is described above. A low-pass filter 507 may be linked to an output of the mixer 505. The level s(f) of the signal thus mixed and filtered can then be stored by appropriate means. Calculation and analysis means can then allow the determination of the correlation function, and the calculation of the value of difference between the natural resonant frequencies and of the quantized value corresponding to the physical parameter measured.

As is described above, the level of the in-phase or quadrature component of the filtered and mixed signal may be utilized for the determination of the measurement. Thus, according to an advantage of the present invention, it is possible to use a radio-modem to carry out the measurement, and form a cheaper interrogation device.

It is for example possible to use a direct conversion radio-modem, processing radiofrequency signals in the ISM band considered and generating in-phase and quadrature signals. Such a radio-modem can generate a radiofrequency signal at a digitally programmed frequency to configure a fractional phase-locked loop or "PLL", multiplying the signal arising from a reference oscillator as a signal around the frequency of 434±1 MHz arising from a voltage-controlled oscillator or "VCO", the initials corresponding to the terminology "Voltage-Controlled Oscillator". The same VCO can control the input of the local oscillator of a mixer which brings the received and amplified frequency into the passband of a configurable low-pass filter.

Thus, one and the same radio-modem may be used at one and the same time for emitting the interrogation signal, for gathering the echo signal, amplifying it, for mixing frequencies and for extracting the components I and Q which allow the analysis.

Figure 6:
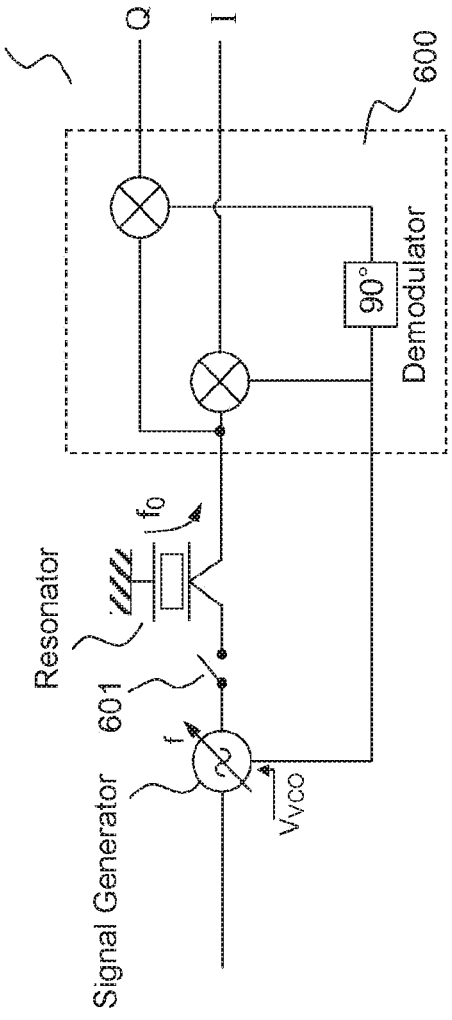
FIG. 6, a diagram illustrating in a schematic manner a device for interrogating a differential SAW or BAW sensor, formed by a radio-modem.

FIG. 6 presents a diagram illustrating in a schematic manner, a differential SAW or BAW sensor interrogation device, formed by a radio-modem.

In the manner of the interrogation device illustrated by FIG. 5 described above, an interrogation device 60 can comprise a radiofrequency switch 601 and a radiofrequency signals generation module 603 based on a VCO receiving a control voltage $V_{VCO}$. The signal received as echo from a resonator R, received by an antenna and after amplification, can then be decomposed into in-phase and quadrature components, by a demodulator 600. The level of the signals I or Q can then be utilized by appropriate means, not represented in the figure.

The radiofrequency switch 601, the radiofrequency signals generation module 603 and the demodulator 600 can all be integrated into the radio-modem.

The invention claimed is:

1. A method of interrogating a sensor comprising at least two resonators whose natural resonant frequency is dependent on a physical parameter using an interrogation device, the method comprising:

a step of emitting, from a radio signal generator of the interrogation device, an electromagnetic signal whose frequency is varied in a frequency band by increments of determined value, from a predetermined minimum value to a predetermined maximum value, the frequency band being split into two frequency sub-bands, each frequency sub-band containing at least the expected values respectively of each natural resonant frequency of the two resonators, a step of gathering, at an antenna of the interrogation device, a signal received as an echo from a resonator in the at least two resonators after a determined duration after the emission carried out in the emission step, for each frequency of the electromagnetic signal emitted, a step of transposing, at a mixer of the interrogation device, the signal received as the echo to low frequency by mixing with a radiofrequency signal whose frequency equals the frequency of the electromagnetic signal emitted, a filtering step, at a filter of the interrogation device, to eliminate the high frequencies of the signal mixed in the transposition step, and a step of determining, using calculation means, the difference between the respective natural resonant frequencies of the said two resonators, on the basis of the cross-correlation maximum of the characteristics constituted by the level of the signal received as the echo for each frequency sub-band as a function of the frequency of the electromagnetic signal emitted.

2. The method according to claim 1, wherein the cross-correlation maximum is defined by the maximum value of the cross-correlation coefficient defined according to the relation:

$$X_{corr}(t) = \sum_{k=-M}^{M} s_1(k)s_2(k-t),$$

in which t denotes a frequency gap, $s_1$ denotes the level of the signal received in the first frequency sub-band, and $s_2$ denotes the level of the signal received in the second frequency band, M denoting a number of interrogation frequency points in a frequency sub-band, the second frequency sub-band assumed to contain at least the second resonant frequency comprising N-M points, N being the total number of interrogation frequency points.

3. The method according to claim 2, wherein the narrowest sub-band is supplemented with zeros for the interrogation frequency points situated outside of the measurement band, in such a way that the number of frequency points is identical for the two frequency sub-bands.

4. The method according to claim 3, wherein the said difference between the natural resonant frequencies is determined according to the relation: $f_2-f_1=(t+M)\cdot\Delta f$, t denoting the frequency gap for which the cross-correlation coefficient is maximal.

5. The method of interrogating according to claim 1, the interrogation device comprising:
   a radiofrequency switch,
   a radiofrequency signal generator controlled by the radiofrequency switch and emitting the interrogation signals at the said variable frequency, an emission antenna,
   a reception antenna receiving the signals as the echo,
   an amplification module amplifying the signals received by the reception antenna,
   a mixer mixing the amplified signal received as the echo and a periodic signal at the said variable frequency,
   a low-pass filter linked to an output of the mixer,
   storage means storing the level of the mixed and filtered signal, and
   calculation and analysis means determining the said cross-correlation maximum or auto-correlation maximum.

6. The interrogation device according to claim 5, formed by a device of radio-modem type.

7. A method of interrogating a sensor comprising at least two resonators whose natural resonant frequency is dependent on a physical parameter using an interrogation device, the method comprising:

a step of emitting, from a radio signal generator of the interrogation device, an electromagnetic signal whose frequency is varied in a frequency band by increments of determined value, from a predetermined minimum value to a predetermined maximum value,
   a step of gathering, at an antenna of the interrogation device, a signal received as an echo from a resonator in the at least two resonators after a determined duration after the emission carried out in the emission step, for each frequency of the electromagnetic signal emitted,
   a step of transposing, at a mixer of the interrogation device, the signal received as the echo to low frequency by mixing with a radiofrequency signal whose frequency equals the frequency of the electromagnetic signal emitted,
   a filtering step, at a filter of the interrogation device, to eliminate the high frequencies of the signal mixed in the transposition step,
   a step of determining, using calculation means, the difference between the respective natural resonant frequencies of the said two resonators, on the basis of the autocorrelation maximum of the characteristic constituted by the level of the signal received as the echo.

8. The method according to claim 7, wherein the characteristic constituted by the level of the signal received as the echo is formed by the characteristic of the amplitude of the in-phase component of the said signal received.

9. The method according to claim 7, wherein the characteristic constituted by the level of the signal received as the echo is formed by the characteristic of the amplitude of the quadrature component of the said signal received.

10. The method according to claim 7, wherein the characteristic constituted by the level of the signal received as the echo is formed by the complex number formed by the in-phase and quadrature components of the said signal received, the difference between the natural resonance frequencies of the two resonators being determined based upon the modulus of the maximum of the cross-correlation or autocorrelation function.

11. The method according to claim 10, comprising an additional step of correction of the difference between the natural resonance frequencies realized by means of a linear function of the phase of the cross-correlation or autocorrelation function considered at the position of the maximum of the modulus of the cross-correlation or autocorrelation function.

12. The method according to claim 7, further comprising an adjustment step bringing the base line of the characteristics constituted by the level of the signal received as the echo to a constant value.

13. The method according to claim 12, wherein the constant value is zero.

* * * * *